United States Patent
Suzuki

(10) Patent No.: US 11,977,463 B2
(45) Date of Patent: May 7, 2024

(54) SEMICONDUCTOR DEVICE AND TEST METHOD THEREOF, AND NON-TRANSITORY COMPUTER READABLE MEDIUM

(71) Applicant: Kioxia Corporation, Tokyo (JP)

(72) Inventor: Kunihiko Suzuki, Machida (JP)

(73) Assignee: Kioxia Corporation, Tokyo (JP)

(*) Notice: Subject to any disclaimer, the term of this patent is extended or adjusted under 35 U.S.C. 154(b) by 44 days.

(21) Appl. No.: 17/840,785

(22) Filed: Jun. 15, 2022

(65) Prior Publication Data
US 2023/0176871 A1 Jun. 8, 2023

(30) Foreign Application Priority Data
Dec. 7, 2021 (JP) .................. 2021-198592

(51) Int. Cl.
| | |
|---|---|
| *G06F 11/00* | (2006.01) |
| *G01R 31/28* | (2006.01) |
| *G06F 9/38* | (2018.01) |
| *G06F 11/26* | (2006.01) |
| *G11C 29/56* | (2006.01) |

(52) U.S. Cl.
CPC ............ *G06F 11/26* (2013.01); *G06F 9/3861* (2013.01); *G01R 31/2851* (2013.01); *G11C 29/56* (2013.01)

(58) Field of Classification Search
CPC ... G06F 9/3861; G06F 11/26; G01R 31/2851; G11C 29/56
USPC .................................................. 714/718, 763
See application file for complete search history.

(56) References Cited

U.S. PATENT DOCUMENTS

| | | | |
|---|---|---|---|
| 2004/0177302 A1* | 9/2004 | Mori ................ | G01R 31/31919 714/738 |
| 2005/0262292 A1* | 11/2005 | Kozakai ................ | G11C 16/16 711/115 |
| 2008/0229163 A1 | 9/2008 | Niijima et al. | |
| 2011/0063909 A1* | 3/2011 | Komatsu ................ | G11C 29/28 365/185.11 |

(Continued)

FOREIGN PATENT DOCUMENTS

| | | |
|---|---|---|
| JP | 2006-351056 A | 12/2006 |
| JP | 2007-157303 A | 6/2007 |

(Continued)

*Primary Examiner* — Guy J Lamarre
*Assistant Examiner* — Osman M Alshack
(74) *Attorney, Agent, or Firm* — Oblon, McClelland, Maier & Neustadt, L.L.P.

(57) ABSTRACT

According to a certain embodiment, the semiconductor device includes: an integrated circuit unit; a command control unit configured to execute command control for the integrated circuit unit on the basis of a command, an address, and/or data, each supplied from an outside; an internal state control unit configured to detect an operating state inside the integrated circuit unit, and to provide an internal state signal indicating a first state or a second state in accordance with the detected operating state; and an instruction rejection control unit configured to instruct the internal state control unit to compulsorily turn the internal state signal to the first state if an operation of the integrated circuit unit has not been completed even after a predetermined maximum monitoring time has elapsed, and to instructs the command control unit to reject an input/output operation of the command, the address, and/or the data.

17 Claims, 6 Drawing Sheets

(56) References Cited

U.S. PATENT DOCUMENTS

| | | | | |
|---|---|---|---|---|
| 2014/0204684 A1* | 7/2014 | Kwak | ............... | G11C 16/26 |
| | | | | 365/189.05 |
| 2015/0221381 A1* | 8/2015 | Nam | ............. | G11C 16/3445 |
| | | | | 365/185.12 |
| 2019/0295634 A1* | 9/2019 | Hyodo | ............... | G11C 16/26 |
| 2019/0378590 A1* | 12/2019 | Joo | ............ | G01R 31/31905 |
| 2021/0272645 A1* | 9/2021 | Yoon | ................. | G11C 29/38 |

FOREIGN PATENT DOCUMENTS

| | | | |
|---|---|---|---|
| JP | 2008-287813 | A | 11/2008 |
| JP | 2008287813 | A * | 11/2008 |
| JP | 4991811 | B2 | 8/2012 |

\* cited by examiner ns text..."># SEMICONDUCTOR DEVICE AND TEST METHOD THEREOF, AND NON-TRANSITORY COMPUTER READABLE MEDIUM

CROSS REFERENCE TO RELATED APPLICATIONS

This application is based upon and claims the benefit of priority from prior Japanese Patent Application No. P2021-198592 filed on Dec. 7, 2021, the entire contents of which are incorporated herein by reference.

FIELD

Embodiments described herein relate generally to a semiconductor device, a test method thereof, and a non-transitory computer readable medium.

BACKGROUND

In semiconductor devices, such as semiconductor memory device, devices have been evaluated from various aspects under various test conditions before being shipped to the market in order to avoid market defects.

DETAILED DESCRIPTION

Figure 1:
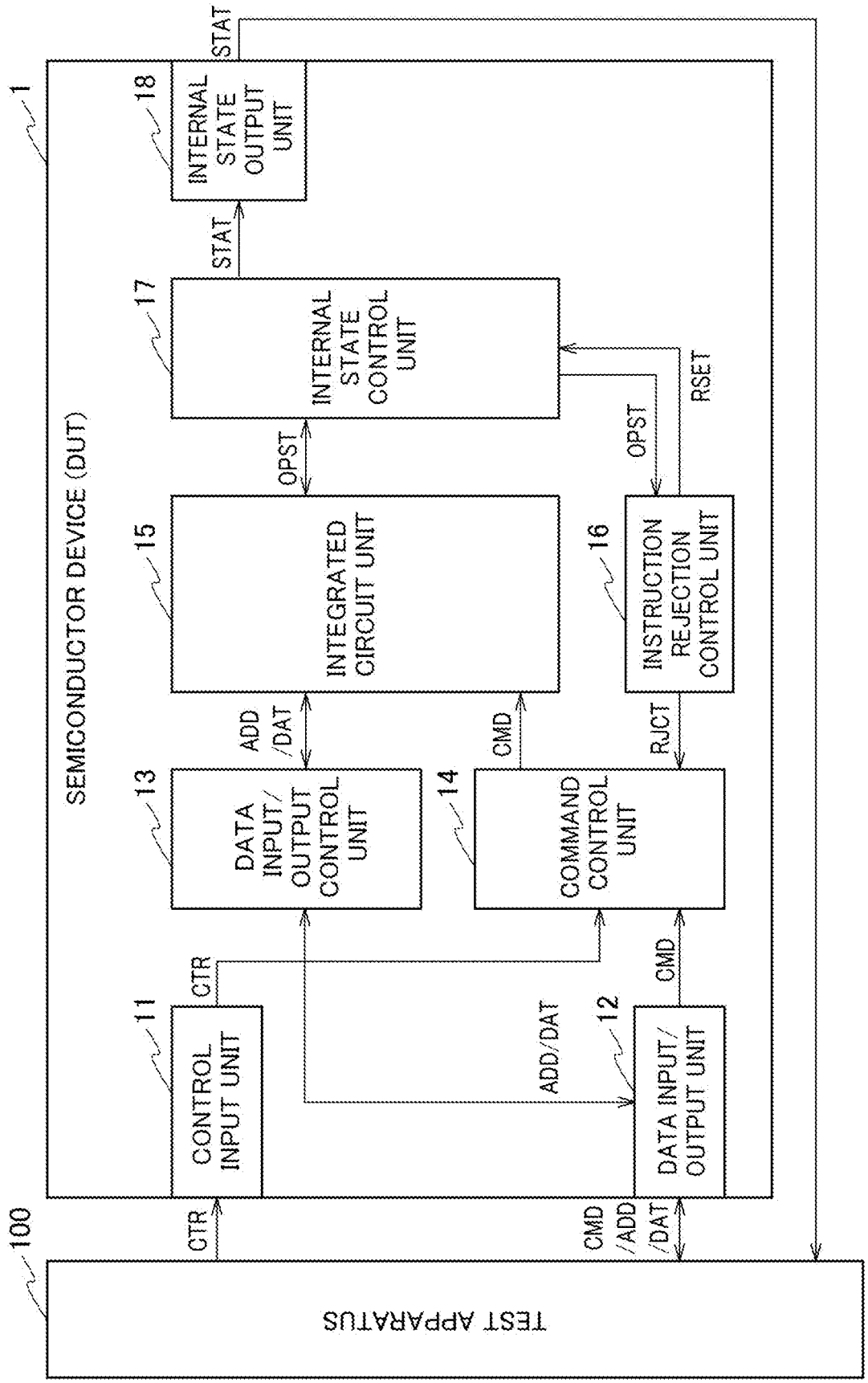
FIG. 1 is a block diagram illustrating an example of an internal configuration of a semiconductor device according to an embodiment.

Next, certain embodiments will now be explained with reference to drawings. In the description of the following specification or drawings to be explained, the identical or similar reference sign is attached to the identical or similar part. However, the drawings are merely schematic. Moreover, the embodiments described hereinafter merely exemplify a device and/or a method for materializing the technical idea. The embodiments may be changed without departing from the spirit or scope of claims.

Certain embodiments provide a semiconductor device, a test method thereof, a non-transitory computer readable medium, capable of shortening time required for testing.

According to one embodiment, a semiconductor device includes an integrated circuit unit, a command control unit, an internal state control unit, and an instruction rejection control unit. The command control unit is configured to execute command control for the integrated circuit unit on the basis of a command, an address, and/or data, each supplied from an outside thereof. The internal state control unit is configured to detect an operating state inside the integrated circuit unit, and to provide an internal state signal indicating a first state or a second state in accordance with the detected operating state. The instruction rejection control unit is configured to instruct the internal state control unit to compulsorily turn the internal state signal to the first state if an operation of the integrated circuit unit has not been completed even after a predetermined maximum monitoring time has elapsed, and to instructs the command control unit to reject an input/output operation of the command, the address, and/or the data.

(Test Process of Semiconductor Device)

As the test of semiconductor devices (semiconductor devices), there are a wafer test process and a package test process. The wafer test process is for testing the semiconductor device in a wafer state. The package test process is for testing the semiconductor device in a state where the wafer is diced into chips and then enclosed in packages. As the package test process, there are a final test process in which a test is performed with a relatively expensive LSI tester and a burn-in process in which a test is performed with a relatively inexpensive burn-in apparatus.

In the final test process of a NAND flash memory (hereafter referred to also as NAND memory), which is one of the semiconductor devices, generally equal to or less than 1,000 pieces of the NAND memory can be simultaneously tested. On the other hand, in the burn-in process of the NAND memory, generally approximately 10,000 pieces of the NAND memory can be simultaneously tested. Although the burn-in apparatus is relatively inexpensive, a long time is required for tests performed under stress, such as a write function, an erase function, or the like.

In recent NAND memories, current consumption per one Device Under Test (DUT) has been increasing. Accordingly, when many NAND memories are simultaneously tested, a heating value of the NAND memories may exceed a power supply current capacity of the burn-in apparatus. Therefore, the number of the DUTs to be tested becomes smaller than the maximum number of the DUTs that can be originally measured by the burn-in apparatus, and thereby test efficiency is deteriorated.

Therefore, in the NAND memories, match processing may be performed in order to shorten the time required for the test. In the NAND memories, when performing function operations, such as write function or erase function, it can be verified whether or not the function operation is completed by means of a ready/busy (R/B) signal provided from a ready/busy (R/B) pin of the NAND memory. In the R/B signal, a high level indicates a ready state (operation completed state), and a low level indicates a busy state (operation non-completed state), for example.

The match processing is executed by the burn-in apparatus during the test of the function operation of the NAND memory. The burn-in apparatus monitors the R/B signal provided from the R/B pin of the NAND memory. Then, when the burn-in apparatus detects of being turned from the busy state in the ready state (i.e., matched), the burn-in apparatus determines that the function has been normally completed (i.e., has been passed), and executes the next test.

At this time, the maximum time (hereinafter referred to as "maximum monitoring time") for monitoring the R/B signal is previously set in consideration of a case where the state is not turned from the ready state to the busy state (i.e., unmatched). More specifically, the maximum monitoring time is a time limit for monitoring. If the state is not turned from the busy state to the ready state, the burn-in apparatus determines that the function operation under the test has not normally completed (i.e., has been failed).

In accordance with such match processing, if the operation under the test has been completed (i.e., if the state has been turned from the busy state to the ready state), the next test can be executed quickly, and thereby the time required for the test can be shortened.

However, in the burn-in process of the NAND memory, since extremely many DUTs are simultaneously tested as mentioned above, it is not possible to prepare resources, such as the R/B pin, for as many DUTs to be tested. Therefore, resources, such as the R/B pin, are shared among a large number of DUTs. The resources to be shared among a large number of the DUTs include, for example, a power supply for device (VS), an input exclusive (Dr) pin, an input/output (IC) pin, an output exclusive (RB) pin, or the like, each provided in the burn-in apparatus.

Therefore, during the match processing, if there is even one DUT (i.e., failed DUT) which has not been turned to the ready state among the DUTs that share the resources of the burn-in apparatus, the remaining DUTs are influenced due to the busy time period of the DUT which has been failed and will wait until the maximum monitoring time is reached. That the test time of the burn-in apparatus is rate-controlled by the DUT which has been failed among the DUTs sharing the resources of the burn-in apparatus.

Depending on the test content, an identical DUT may be failed for each test, and in this case, the test efficiency is further deteriorated. In particular, in the test performed by the burn-in apparatus, the same type of test under stress, such as write function/erase function, is repeated, such an effect becomes more remarkable.

In order to prevent the match processing from waiting until the maximum monitoring time is reached due to the failed DUT, the DUT that has failed may not be tested (i.e., excluded from the test target: reject processing) so that match processing may not be affected by the DUT that has failed.

However, in a general burn-in apparatus, since resources, such as a power supply and various pins, are shared between a large number of DUTs, the failed DUT receives a power supply and a signal from the burn-in apparatus, and thereby cannot be rejected. Provisionally, it is conceivable to insert a relay circuit so as to physically disconnect the burn-in apparatus from the NAND memory, but this is not realistic since there are many DUTs and therefore a circuit scale also becomes larger.

Moreover, when a resource is shared between a large number of the DUTs, it may not be possible to know which DUT is failed merely by referring to the signal provided from the R/B pin. In order to identify which DUT is failed among a large number of the DUTs, it is necessary to read a test result for each DUT. However, since the DUTs can merely be read out sequentially in the burn-in apparatus where the resources are shared between a large number of the DUTs, it requires an enormous amount of time to read out the test results for each DUT.

As described above, in the general burn-in apparatus, since the match processing is rate-controlled by the failed DUT and also the reject processing is not executed, the test time thereof may become long.

First Embodiment

A semiconductor device according to the embodiments has a function of detecting that test results, such as a function test of the semiconductor device, has failed by the semiconductor device itself, which is a device under test (DUT), and excluding the function test concerned from the test target.

In order to realize such a function, the semiconductor device according to the embodiments includes an instruction rejection control unit configured to execute the following functions:

(a) The semiconductor device itself monitors a function test, and if the operation is not completed even after the maximum monitoring time TMAX has elapsed, the instruction rejection control unit determines that the function test has failed, and an internal state signal STAT provided from an internal state output unit included on the semiconductor device is compulsorily turned to a ready mode.

(b) The instruction rejection control unit executes instruction rejection for an input/output operation of command CMD/address ADD/data DAT at the time of determination of being failed.

(c) The instruction rejection control unit can switch compulsory mode/non-compulsory mode (exclusion mode/inclusion mode) with respect to the instruction rejection function in accordance with an external command.

(d) A time common to each function can be set as the maximum monitoring time TMAX.

(e) A different time for each function can be set as the maximum monitoring time TMAX.

(f) The maximum monitoring time TMAX can be set from the outside for each test or before the test.

(Configuration of Semiconductor Device)

FIG. 1 is a block diagram illustrating an example of an internal configuration of a semiconductor device (i.e., DUT) 1 according to the embodiments of the present invention. As illustrated in FIG. 1, the semiconductor device 1 includes a control input unit 11, a data input/output unit 12, a data input/output control unit 13, a command control unit 14, an integrated circuit unit 15, an instruction rejection control unit 16, an internal state control unit 17, and an internal state output unit 18. A semiconductor device 1 is connected to a test apparatus 100 as a tester through the control input unit 11, the data input/output unit 12, and the internal state output unit 18. The test apparatus 100 is a burn-in apparatus, an LSI tester, or the like, for example.

The command control unit 14 executes command control for the integrated circuit unit 15 on the basis of a control signal CTR supplied through the control input unit 11 from the test apparatus 100, a command CMD/address ADD/data DAT supplied through the data input/output unit 12 from the test apparatus 100, and the like.

The data input/output control unit 13 executes input/output control of the address ADD and the data DAT provided/supplied through the data input/output unit 12 between the test apparatus 100 and the integrated circuit unit 15.

During execution of the function test by the semiconductor device 1, the internal state output unit 18 detects an operating state OPST inside the integrated circuit unit 15, and provides an internal state signal STAT from the internal state output unit 18 in accordance with the detected operating state OPST. The internal state signal STAT is provided from the internal state output unit 18 to the test apparatus 100. The internal state signal STAT includes a first state and a second state in accordance with the operating state OPST inside the integrated circuit unit 15. The first state is a state where a function executed by the integrated circuit unit 15 has been normally completed. The second state is a state where a function executed by the integrated circuit unit 15 has not yet completed (i.e., state of still under execution).

For example, when a signal level of the internal state signal STAT is a high level, the first state may be indicated, and when the signal level is a low level, the second state may be indicated.

The instruction rejection control unit 16 monitors the function test, and if the operation has not been completed even after the maximum monitoring time TMAX has elapsed, the instruction rejection control unit 16 determines that the function test has been failed and executes the instruction rejection function with respect to the internal state control unit 17 and the command control unit 14. More specifically, the instruction rejection control unit 16 instructs the internal state control unit 17 to compulsorily turn the internal state signal STAT provided from the internal state output unit 18 to the first state. The instruction to the internal state control unit 17 is executed on the basis of a first instruction signal RSET. The instruction rejection control unit 16 instructs to the command control unit 14 to execute the instruction rejection with respect to the input/output operation of the command CMD/address ADD/data DAT when determining of being failed. The instruction rejection applied to the input/output operation of the command CMD/address ADD/data DAT means that the input/output operation of the command CMD/address ADD/data DAT is ignored. The instruction to the command control unit 14 is executed on the basis of a second instruction signal RJCT.

The integrated circuit unit 15 is an electronic circuit formed by using a semiconductor. The integrated circuit units 15 is a semiconductor memory, a microcomputer, a logic integrated circuit, an analog integrated circuit, or the like, for example. AND, OR, NAND, NOR, XOR, an inverter, an AND-OR inverter (AOI), an OR-AND inverter (OAI), a multiplexer (MUX), a flip-flop, a buffer gate, a latch gate, a delay cell, a clock cell, or the like can be applied as the logic integrated circuit. Moreover, if the integrated circuit unit 15 is a semiconductor memory, the semiconductor memory is a volatile memory or nonvolatile memory, for example. The nonvolatile memory is a NAND flash memory, for example. As other memories, there are applicable a Static Random Access Memory (SRAM), a Dynamic Random Access Memory (DRAM), a Resistive Random Access Memory (ReRAM), a Phase Change Memory (PCM), a Magnetic Random Access Memory (MRAM), a Read Only Memory (ROM), etc.

If the integrated circuit unit 15 is a NAND flash memory, the control signal CTR supplied from the test apparatus 100 may also include, for example, a chip enable signal, an address latch enable signal, a command latch enable signal, a write enable signal, a read enable signal, a write protect signal, and the like. If the integrated circuit unit 15 is the NAND flash memory, the command CMD supplied from the test apparatus 100 may also include, for example, a write command, a read command, an erase command, a status read command, a defective block command, and the like.

Moreover, if the integrated circuit unit 15 is the NAND flash memory, the control input unit 11 may be a CONTROL pin, the data input/output unit 12 may be a DQ pin, and the internal state output unit 18 may be a ready/busy (R/B) pin. If the internal state output unit 18 is then R/B pin, the first state may be in a "ready" state and the second state may be a "busy" state.

(Instruction Rejection Control Unit)

Figure 2:
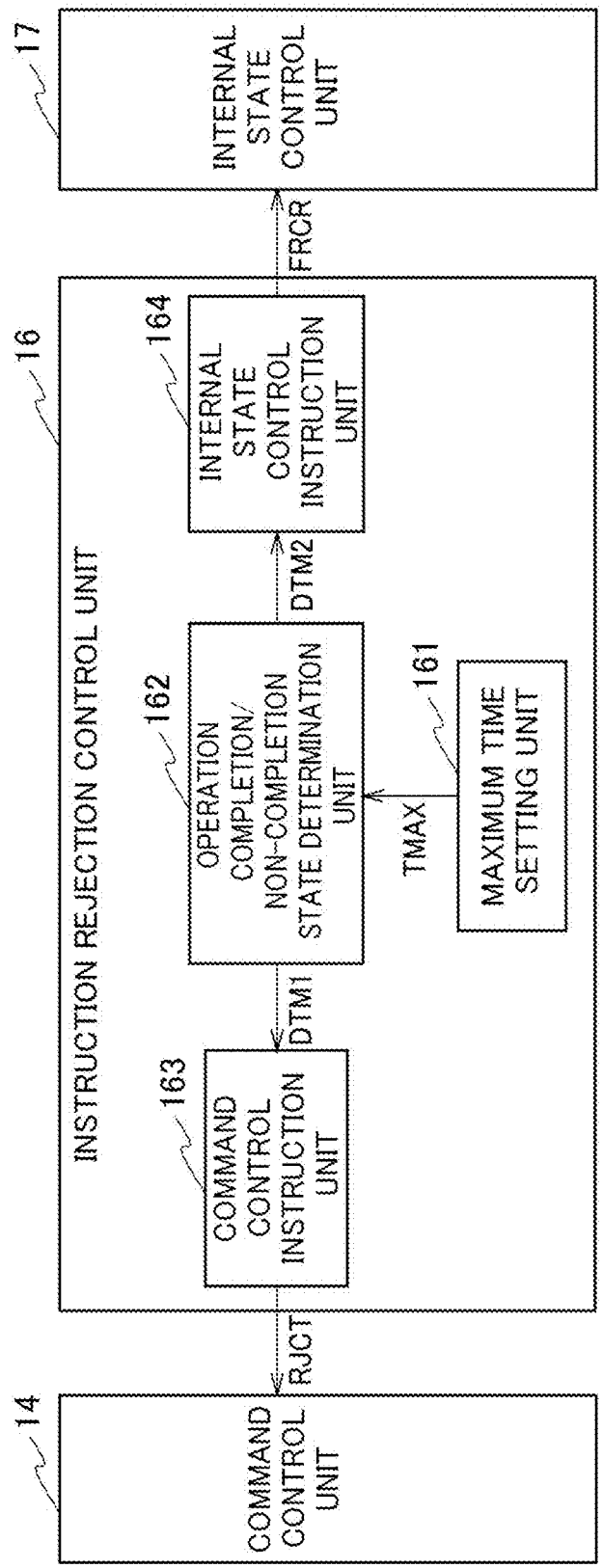
FIG. 2 is a block diagram illustrating an example of an internal configuration of an instruction rejection control unit included in the semiconductor device illustrated in FIG. 1.

FIG. 2 illustrates an example of an internal configuration of the instruction rejection control unit 16. The instruction rejection control unit 16 includes a maximum time setting unit 161, an operation completion/incompletion state determination unit 162, a command control instruction unit 163, and an internal state control instruction unit 164.

The maximum time setting unit 161 is configured to set the maximum monitoring time TMAX. A time common to each function can be set as the maximum monitoring time TMAX. Alternatively, a different time for each function can be set as the maximum monitoring time TMAX.

Alternatively, the maximum monitoring time TMAX may be previously set for the maximum time setting unit 161 from the outside of the semiconductor device 1 before the test. The outside of the semiconductor device 1 corresponds to the test apparatus 100, for example. Alternatively, the maximum monitoring time TMAX may be set for the maximum time setting unit 161 for each test.

When the maximum monitoring time TMAX of the function operation set in the maximum time setting unit 161 has lapsed, the operation completion/incompletion state determination unit 162 determines that the function operation has completed or has not completed, and controls the command control instruction unit 163 and the internal state control instruction unit 164 on the basis of a result of the determination.

The command control instruction unit 163 instructs the command control unit 14 to execute the instruction rejection for the input/output operation of the command CMD/address ADD/data DAT in accordance with the instruction from the operation completion/incompletion state determination unit 162.

The internal state control instruction unit 164 instructs the internal state control unit 17 to compulsorily turn, to the first state, the internal state signal STAT provided from the internal state output unit 18 in accordance with the instruction from the operation completion/incompletion state determination unit 162.

In addition, the internal state control instruction unit 164 cancels the instruction rejection for the command control unit 14 and the first state compulsorily set for the internal state control unit 17, when the semiconductor device 1 is started. The time when the semiconductor device 1 is started is, for example, when the power of the semiconductor device 1 is turned on.

(Processing Operation of Semiconductor Device)

Figure 3:
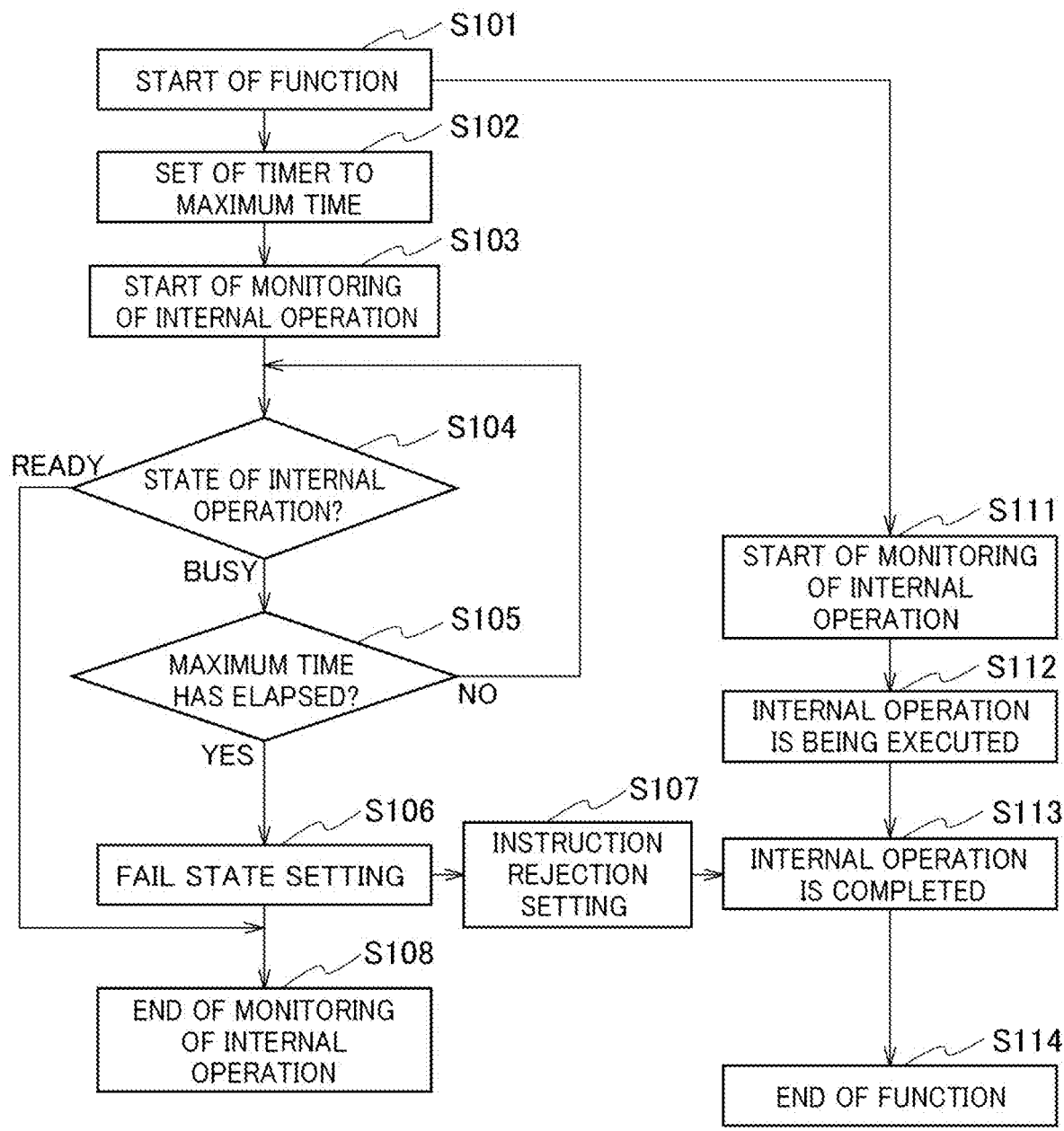
FIG. 3 is a flow chart illustrating an example of a processing operation of the semiconductor device in a first embodiment.

FIG. 3 is a flow chart illustrating an example of a processing operation of a semiconductor device 1 according to a first embodiment.

Execution of a function operation is started in the semiconductor device 1 in accordance with the command CMD, such as program, read, or erase command, supplied from the test apparatus 100 (Step S101).

The maximum time setting unit 161 in the instruction rejection control unit 16 sets the maximum monitoring time TMAX (Step S102).

The operation completion/incompletion state determination unit 162 in the instruction rejection control unit 16 starts monitoring of a function test executed in the semiconductor device 1 (Step S103). For example, the operation completion/incompletion state determination unit 162 may monitor the operating state OPST inside the integrated circuit unit 15 through the internal state control unit 17, or may directly monitor the integrated circuit unit 15.

The operation completion/incompletion state determination unit 162 monitors the operating state OPST inside the integrated circuit unit 15 from starting of the monitor until the maximum monitoring time TMAX is reached (Steps S104 to S105).

On the other hand, when the execution of the function operation is started in Step S101, the internal state control unit 17 starts monitoring of the operating state OPST inside the integrated circuit unit 15 (Step S111). At this time, the internal state control unit 17 turns the internal state signal STAT provided from the internal state output unit 18 from the first state to the second state. The internal state control unit 17 maintains the internal state signal STAT in the second state during the execution of the function operation (Step S112), and turns the internal state signal STAT from a second state to the first state at the time when the function operation is completed (Step S113).

On the other hand, in Step, S104, if the operation completion/incompletion state determination unit 162 which is monitoring the operating state OPST inside the integrated circuit unit 15 detects that the function operation has been completed before the maximum monitoring time TMAX is reached (S104: Ready), the determination unit 162 determines that the function test has been normally completed (i.e., passed), and ends the monitoring processing (Step S108).

In contrast, if the function operation has not been completed even after the maximum monitoring time TMAX is reached (S105: Busy→S106: Yes), the operation completion/incompletion state determination unit 162 determines that a result of the function test is failed (Step S106). Then, the instruction rejection control unit 16 sends the first instruction signal RSET to the internal state control unit 17 so as to compulsorily turn, to the first state, the internal state signal STAT provided from the internal state output unit 18 (Step S107). At the same time, the instruction rejection control unit 16 sends the second instruction signal RJCT to the command control unit 14 so as to execute the instruction rejection with respect to the input/output operation of the command CMD/address ADD/data DAT (Step S107). The instruction rejection control unit 16 then ends the series of monitoring processings (Step S108).

The internal state control unit 17 which has received the first instruction signal RSET compulsorily returns the internal state signal STAT provided from the internal state output unit 18 to the first state (Step S113). Furthermore, the command control unit 14 which has received the second instruction signal RJCT executes the instruction rejection with respect to the input/output operation of the command CMD/address ADD/data DAT (Step S113). The function operation is then completed (Step S114).

(Working Effect According to First Embodiment)

The semiconductor device 1 itself monitors a function test, and if the operation is not completed even after the maximum monitoring time TMAX has elapsed, semiconductor device 1 determines that the function test has been failed and compulsorily turns the internal state signal STAT to the first state (ready), and executes the instruction rejection with respect to the input/output operation of the command CMD/address ADD/data DAT. Consequently, the semiconductor device 1 itself, which is a DUT, can detect that the function test result has been failed, and thereby can exclude the function test concerned from the test target. Therefore, during the match processing, even if there is even one DUT (i.e., failed DUT) which has not been turned to the ready state among the DUTs that share the resources of the test apparatus 100, it is possible to prevent the remaining DUTs from waiting until the maximum monitoring time TMAX is reached due to the busy time period of the DUT which has been failed.

In addition, as the maximum monitoring time TMAX, a common time can be set for each function, or a different time can be set for each function. Furthermore, the maximum monitoring time TMAX may be previously set from the outside of the semiconductor device 1 before the test, or may be set for each test. Therefore, an effect of shortening the test time can further be improved.

Second Embodiment

There is a possibility that when a plurality of semiconductor devices (i.e., DUTs) 1 are simultaneously tested, a heating value of the DUT 1 may exceed a power supply current capacity of the test apparatus 100. Therefore, the number of the DUTs 1 to be tested becomes smaller than the maximum number of the DUTs 1 that can be originally tested, and thereby test efficiency is deteriorated.

Accordingly, the second embodiment is configured so that a compulsory mode/non-compulsory mode of the instruction rejection function (exclusion mode/inclusion mode) can be set from the outside (e.g., the test apparatus 100 side) before the test is started.

Thereby, the test can be executed by previously reducing the number of the semiconductor devices 1 by compulsorily applying the instruction rejection function (exclusion mode) to only the test item in which a heating value generated from the DUT 1 becomes too much, for example. Then, after the test item having too much heating value generated from the DUT 1 has been completed, all the DUTs 1 can be simultaneously tested again by supplying a command for canceling the exclusion mode to be turned to the inclusion mode.

Figure 4:
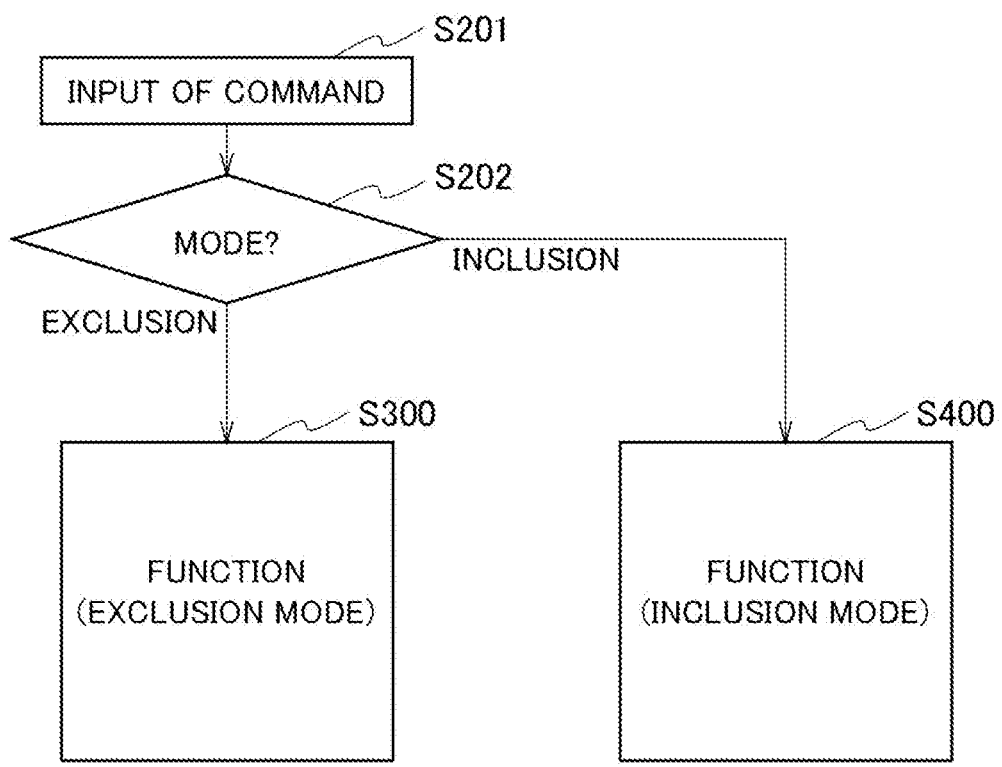
FIG. 4 is a flow chart illustrating an example of a processing operation of the semiconductor device in a second embodiment.

FIG. 4 illustrates an example of a processing operation of the semiconductor device 1 according to the second embodiment. In addition, FIG. 5 illustrates an example of a processing operation in the exclusion mode and FIG. 6 illustrates an example of a processing operation in the inclusion mode, in the processing operation illustrated in FIG. 4.

In FIG. 4, a command is supplied from the outside thereof before the test is started (Step S201).

If the command supplied at Step S201 is a command for indicating the exclusion mode, the function operation is executed in the exclusion mode (Step S300). In contrast, if the command supplied at Step S201 is a command for indicating the inclusion mode, the function operation is supplied in the inclusion mode (Step S400).

Figure 5:
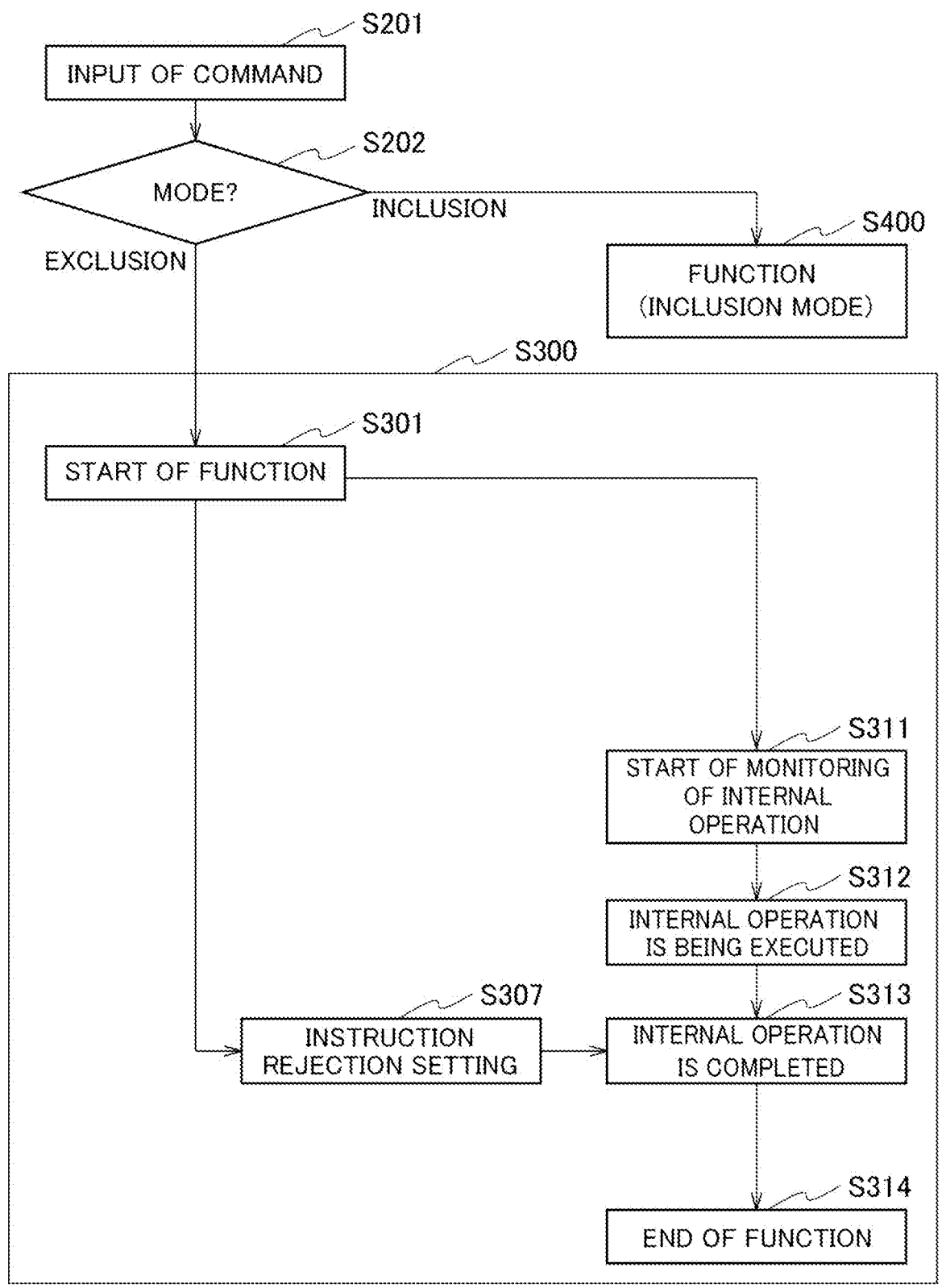
FIG. 5 is a flow chart illustrating an example of a processing operation in an exclusion mode of the processing operation illustrated in FIG. 4.
Figure 6:
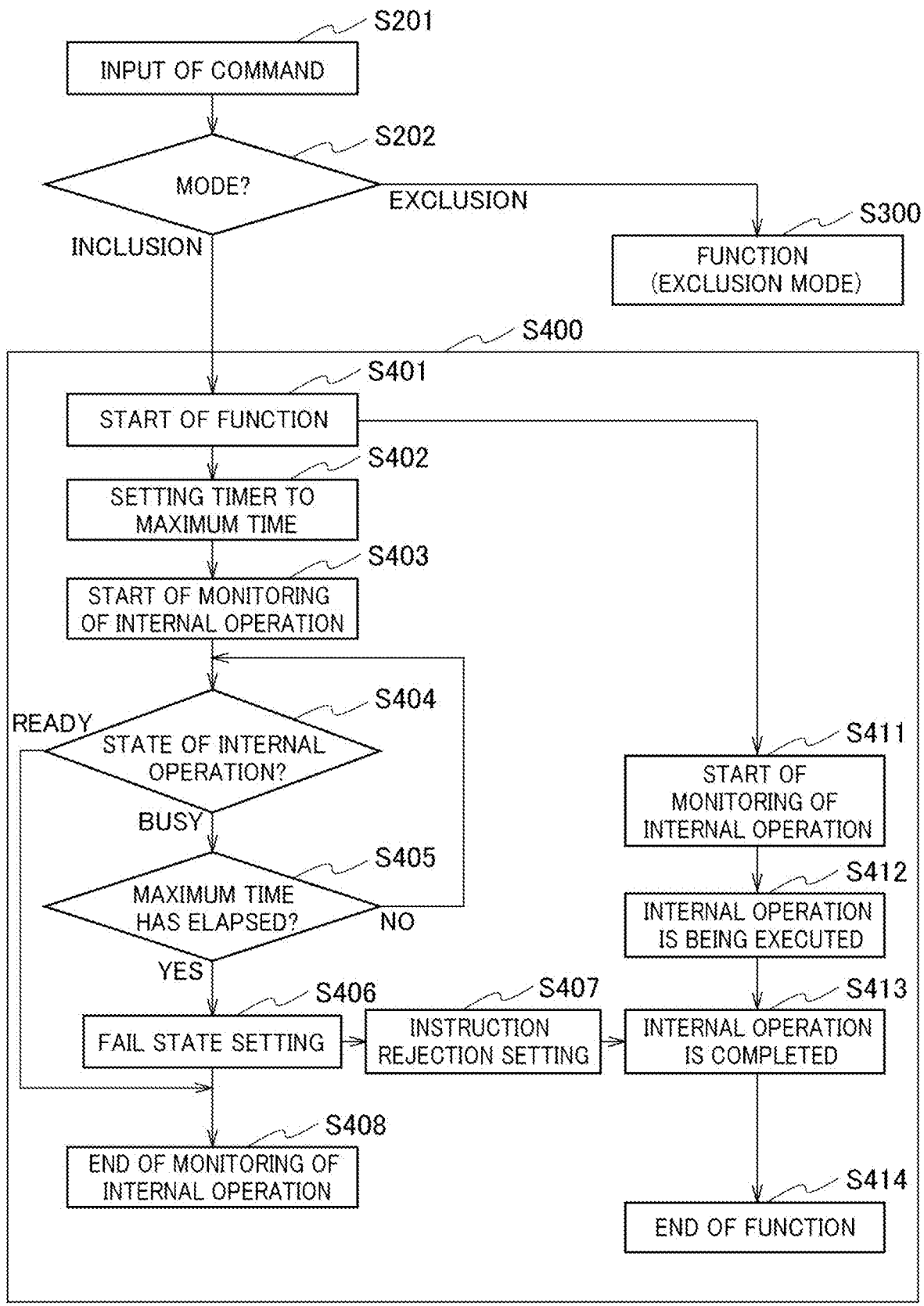
FIG. 6 is a flow chart illustrating an example of a processing operation in an inclusion mode of the processing operation illustrated in FIG. 4.

With reference to FIG. 5, execution of a function operation is started in the semiconductor device 1 in accordance with the command CMD, such as program, read, or erase command, supplied from the test apparatus 100 (Step S301).

The internal state control unit 17 starts monitoring of the operating state OPST inside the integrated circuit unit 15 (Step S311). At this time, the internal state control unit 17 turns the internal state signal STAT provided from the internal state output unit 18 from the first state to the second state. The internal state control unit 17 maintains the internal state signal STAT in the second state during the execution of the function operation (Step S312), and turns the internal state signal STAT from a second state to the first state at the time when the function operation is completed (Step S313).

In contrast, since the command supplied at Step S201 corresponds to the exclusion mode, the instruction rejection control unit 16 executes instruction rejection setting processing (Step S307). The processing in Step S307 is the same as the processing in Step S107 illustrated in FIG. 3. More specifically, the instruction rejection control unit 16 sends the first instruction signal RSET to the internal state control unit 17 so as to compulsorily turn, to the first state, the internal state signal STAT provided from the internal state output unit 18. At the same time, the instruction rejection control unit 16 sends the second instruction signal RJCT to the command control unit 14 so as to execute the instruction rejection with respect to the input/output operation of the command CMD/address ADD/data DAT.

That is, if the command for indicating the exclusion mode is supplied, the instruction rejection control unit 16 compulsorily executes the instruction rejection setting processing in Step S307 without executing the monitoring processing in Steps S102 to S106 illustrated in FIG. 3.

In contrast, if the command supplied at Step S201 is the command for indicating the inclusion mode, the function operation is executed in the inclusion mode as illustrated in FIG. 6 (Step S400). Steps S401 to S408 and S411 to S414 in Step 400 are respectively the same as Steps S101 to S108 and S111 to S114 in the first embodiment illustrated in FIG. 3, and therefore the explanation thereof is omitted.

(Working Effect According to Second Embodiment)

According to the second embodiment, the test can be executed by previously reducing the number of the semiconductor devices 1 by compulsively applying the instruction rejection function (exclusion mode) to only the test item in which a heating value generated from the DUT 1 becomes too much, for example. Then, after the test item having too much heating value generated from the DUT 1 has been completed, all the DUTs 1 can be simultaneously tested again by supplying a command for canceling the exclusion mode to be turned to the inclusion mode.

Accordingly, since it is not necessary to reduce the number of the DUTs 1 of the whole test item, thereby improving throughput.

It should be noted that the processing operations illustrated to FIGS. 3 to 6 can also be described in a computer program as instructions to be executed by computers. The computer program is stored in, for example, a non-transitory computer readable medium and is used for tests, etc. of the semiconductor device 1.

While certain embodiments have been described, these embodiments have been presented by way of examples only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device, comprising:
an integrated circuit unit;
a command control unit configured to execute command control for the integrated circuit unit based on a command, an address, and/or data, each supplied from an outside thereof;
an internal state control unit configured to detect an operating state inside the integrated circuit unit, and to provide an internal state signal indicating a first state or a second state in accordance with the detected operating state; and
an instruction rejection control unit comprising an operation completion/incompletion state determination unit, an internal state control instruction unit, and a command control instruction unit, the operation completion/incompletion state determination unit being configured to determine completion/incompletion of an operation of the integrated circuit unit during a period of a predetermined maximum monitoring time, and to determine that the operation of the integrated circuit unit is failed when the operation of the integrated circuit unit has not been completed even after the predetermined maximum monitoring time has elapsed, the internal state control instruction unit being configured to send a first instruction signal to the internal state control unit to instruct the internal state control unit to compulsorily turn the internal state signal to the first state when the operation of the integrated circuit unit is failed as a result of the determination by the operation completion/incompletion state determination unit, the command control instruction unit being configured to send a second instruction signal to the command control unit to instruct the command control unit to reject an input/output operation of the command, the address, and/or the data when the operation of the integrated circuit unit is failed as the result of the determination by the operation completion/incompletion state determination unit, wherein
the internal state control unit is configured to compulsorily turn the internal state signal to the first state when receiving the first instruction signal, and
the command control unit is configured to reject the input/output operation of the command, the address, and/or the data when receiving the second instruction signal.

2. The semiconductor device according to claim 1, wherein the instruction rejection control unit is further configured to switch compulsion/non-compulsion of the rejection when a specific command is supplied.

3. The semiconductor device according to claim 1, wherein a common time for each of functions executed by the integrated circuit unit or a different time for each of the function is set as the maximum monitoring time.

4. The semiconductor device according to claim 1, wherein the maximum monitoring time is set before a test of the integrated circuit unit or is set for each test of the integrated circuit unit.

5. The semiconductor device according to claim 1, wherein the integrated circuit unit is a nonvolatile semiconductor memory.

6. The semiconductor device according to claim 5, wherein the first state is a ready state and the second state is a busy state.

7. The semiconductor device according to claim 1, wherein the instruction rejection control unit comprises a maximum time setting unit configured to set the maximum monitoring time.

8. The semiconductor device according to claim 1, wherein the command control unit is further configured to ignore the input/output operation of the command, the address, and/or the data, when being instructed, from the instruction rejection control unit, to reject the input/output operation of the command, the address, and/or the data.

9. A test method of a semiconductor device, the semiconductor device comprising an integrated circuit unit, a command control unit, an internal state control unit, and an instruction rejection control unit, the instruction rejection control unit comprising an operation completion/incompletion state determination unit, an internal state control instruction unit, and a command control instruction unit, the test method comprising:
executing, by the command control unit, command control for the integrated circuit unit based on a command, an address, and/or data, each supplied from an outside thereof;
detecting, by the internal state control unit, an operating state inside the integrated circuit unit, and providing, by the internal state control unit, an internal state signal indicating a first state or a second state in accordance with the detected operating state;

determining, by an operation completion/incompletion state determination unit, completion/incompletion of an operation of the integrated circuit unit during a period of a predetermined maximum monitoring time, and determining, by the operation completion/incompletion state determination unit, that the operation of the integrated circuit unit is failed when the operation of the integrated circuit unit has not been completed even after the predetermined maximum monitoring time has elapsed, sending, by the internal state control instruction unit a first instruction signal to the internal state control unit to instruct the internal state control unit to compulsorily turn the internal state signal to the first state when the operation of the integrated circuit unit is failed as a result of the determination by the operation completion/incompletion state determination unit, and sending, by the command control instruction unit, a second instruction signal to the command control unit to instruct the command control unit to reject an input/output operation of the command, the address, and/or the data when the operation of the integrated circuit unit is failed as the result of the determination by the operation completion/incompletion state determination unit;

compulsorily turning, by the internal state control unit, the internal state signal to the first state when receiving the first instruction signal; and rejecting, by the command control unit, the input/output operation of the command, the address, and/or the data when receiving the second instruction signal.

10. The test method according to claim 9, further comprising switching, by the instruction rejection control unit, compulsion/non-compulsion of the rejection when a specific command is supplied.

11. The test method according to claim 9, wherein a common time for each of functions executed by the integrated circuit unit or a different time for each of the function is set as the maximum monitoring time.

12. The test method according to claim 9, wherein the maximum monitoring time is set before a test of the integrated circuit unit or is set for each test of the integrated circuit unit.

13. The test method according to claim 9, wherein the integrated circuit unit is a nonvolatile semiconductor memory.

14. The test method according to claim 13, wherein the first state is a ready state and the second state is a busy state.

15. A non-transitory computer-readable medium in which a computer program is stored, the computer program being executed by a computer used for a test of a semiconductor device, the semiconductor device comprising an integrated circuit unit, a command control unit, an internal state control unit, and an instruction rejection control unit, the instruction rejection control unit comprising an operation completion/incompletion state determination unit, an internal state control instruction unit, and a command control instruction unit, the computer program comprising:

causing the command control unit to execute command control for the integrated circuit unit based on a command, an address, and/or data, each supplied from an outside thereof;

causing the internal state control unit configured to detect an operating state inside the integrated circuit unit, and to provide an internal state signal indicating a first state or a second state in accordance with the detected operating state; and causing an operation completion/incompletion state determination unit to determine completion/incompletion of an operation of the integrated circuit unit during a period of a predetermined maximum monitoring time and to determine that the operation of the integrated circuit unit is failed when the operation of the integrated circuit unit has not been completed even after the predetermined maximum monitoring time has elapsed, causing the internal state control instruction unit to send a second instruction signal to the internal state control unit instruct the internal state control unit to compulsorily turn the internal state signal to the first state when the operation of the integrated circuit unit is failed as a result of the determination by the operation completion/incompletion state determination unit, and causing the command control instruction unit to send a second instruction signal to the command control unit to instruct the command control unit to reject an input/output operation of the command, the address, and/or the data when the operation of the integrated circuit unit is failed as the result of the determination by the operation completion/incompletion state determination unit, causing the internal state control unit to compulsorily turn the internal state signal to the first state when receiving the first instruction signal; and causing the command control unit to reject the input/output operation of the command, the address, and/or the data when receiving the second instruction signal.

16. The non-transitory computer readable medium according to claim 15, wherein the computer program being executed by the computer further comprises causing the instruction rejection control unit to switch compulsion/non-compulsion of the rejection when a specific command is supplied.

17. The non-transitory computer readable medium according to claim 15, wherein a common time for each of functions executed by the integrated circuit unit or a different time fir each of the function is set as the maximum monitoring time.

* * * * *